(12) United States Patent
Ueno et al.

(10) Patent No.: US 11,837,656 B2
(45) Date of Patent: Dec. 5, 2023

(54) NITRIDE SEMICONDUCTOR DEVICE

(71) Applicant: FUJI ELECTRIC CO., LTD., Kawasaki (JP)

(72) Inventors: Katsunori Ueno, Nagano (JP); Yuki Ohuchi, Tokyo (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 260 days.

(21) Appl. No.: 17/481,419

(22) Filed: Sep. 22, 2021

(65) Prior Publication Data
US 2022/0140134 A1 May 5, 2022

(30) Foreign Application Priority Data

Nov. 2, 2020 (JP) ................. 2020-183720

(51) Int. Cl.
*H01L 29/78* (2006.01)
*H01L 29/47* (2006.01)
*H01L 29/20* (2006.01)

(52) U.S. Cl.
CPC ...... *H01L 29/7813* (2013.01); *H01L 29/2003* (2013.01); *H01L 29/475* (2013.01)

(58) Field of Classification Search
None
See application file for complete search history.

(56) References Cited

U.S. PATENT DOCUMENTS

| 8,093,627 | B2 | 1/2012 | Otake et al. |
| 2009/0179227 | A1 | 7/2009 | Otake et al. |
| 2022/0140134 | A1* | 5/2022 | Ueno ............... H01L 29/7813 257/76 |

FOREIGN PATENT DOCUMENTS

| JP | 2009117820 A | 5/2009 |
| JP | 2009164235 A | 7/2009 |

* cited by examiner

Primary Examiner — Jack S Chen

(57) ABSTRACT

To provide a nitride semiconductor device excellent in switching characteristics. A nitride semiconductor device includes: a gallium nitride layer having a first principal surface and a second principal surface located on an opposite side to the first principal surface and having a trench formed from the first principal surface to the second principal surface side; and a field effect transistor formed in the gallium nitride layer, wherein the trench has a first side surface and a second side surface inside the trench, the first side surface is a nitrogen face in the surface layer of which nitrogen atoms are located, the second side surface is a gallium face in the surface layer of which gallium atoms are located, and the field effect transistor has: a gate insulating film formed on the first side surface; and a gate electrode formed in the trench and covering the gate insulating film.

7 Claims, 13 Drawing Sheets

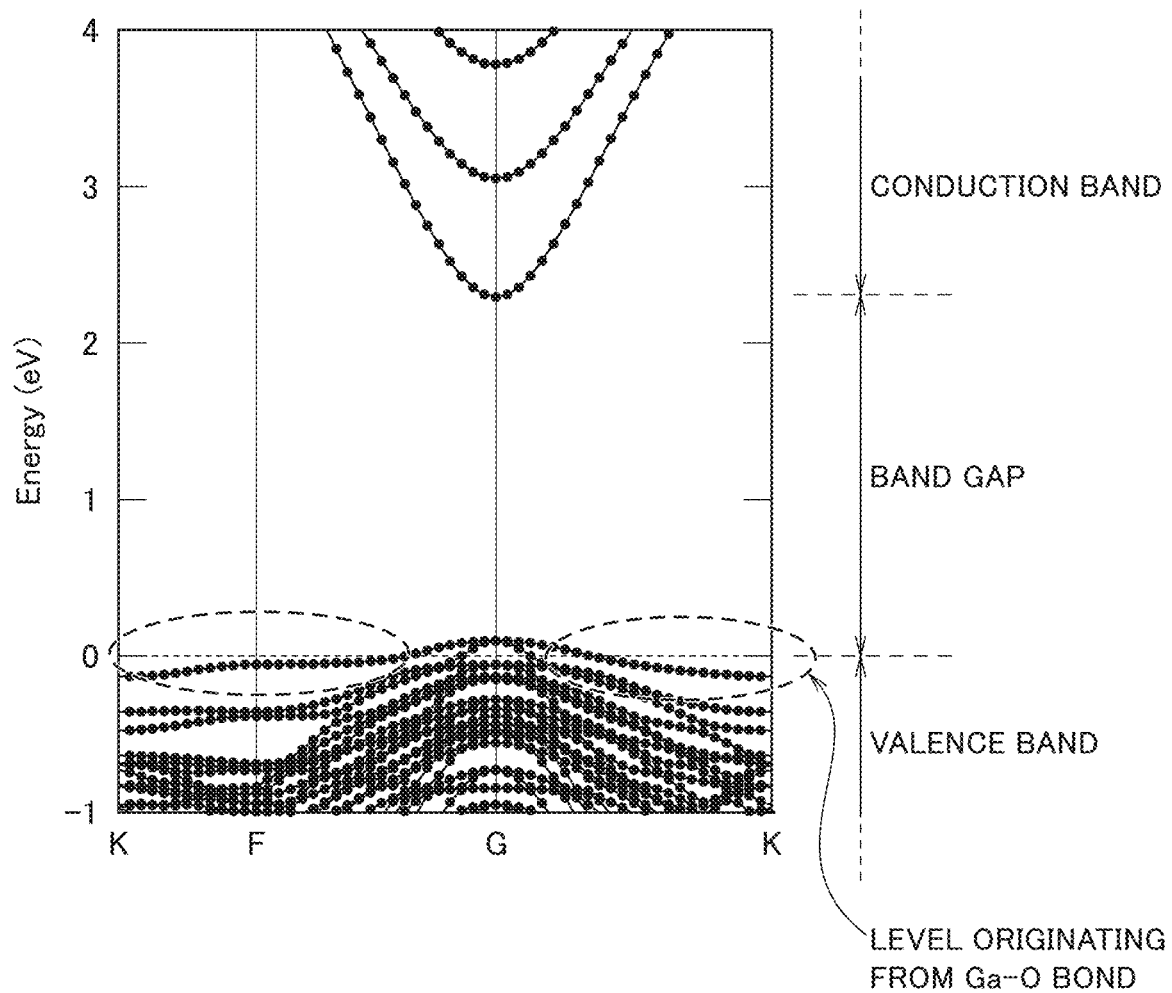

NITRIDE SEMICONDUCTOR DEVICE

CROSS REFERENCE TO RELATED APPLICATIONS AND INCORPORATION BY REFERENCE

This application claims benefit of priority under 35 USC 119 based on Japanese Patent Application No. 2020-183720 filed on Nov. 2, 2020, the entire contents of which are incorporated by reference herein.

TECHNICAL FIELD

The present invention relates to a nitride semiconductor device.

BACKGROUND ART

Conventionally, metal oxide semiconductor field effect transistors (MOSFETs) having a structure in which a trench is formed in a gallium nitride (GaN) layer and a gate insulating film and a gate electrode are formed in the trench have been known (see, for example, PTLs 1 and 2).

CITATION LIST

Patent Literature

PTL 1: JP 2009-117820 A
PTL 2: JP 2009-164235 A

SUMMARY OF INVENTION

Nitride semiconductor devices having a small variation in switching characteristics of a MOSFET are expected.

The present invention has been made in consideration of the above-described problem, and an object of the present invention is to provide a nitride semiconductor device capable of reducing variation in switching characteristics.

In order to achieve the above-described object, according to an aspect of the present invention, there is provided a nitride semiconductor device including: a gallium nitride layer having a first principal surface and a second principal surface located on an opposite side to the first principal surface and having a trench formed from the first principal surface to the second principal surface side; and a field effect transistor formed in the gallium nitride layer, wherein the trench has a first side surface and a second side surface inside the trench, the first side surface is a nitrogen face in the surface layer of which nitrogen atoms are located, the second side surface is a gallium face in the surface layer of which gallium atoms are located, and the field effect transistor has: a gate insulating film formed on the first side surface; and a gate electrode formed in the trench and covering the gate insulating film.

The present invention enables a nitride semiconductor device excellent in switching characteristics to be provided.

BRIEF DESCRIPTION OF DRAWINGS

FIG. 4C is a diagram illustrative of a band gap at the interface between the Ga face of the GaN layer and the $SiO_2$ film;

DETAILED DESCRIPTION

Figure 1:
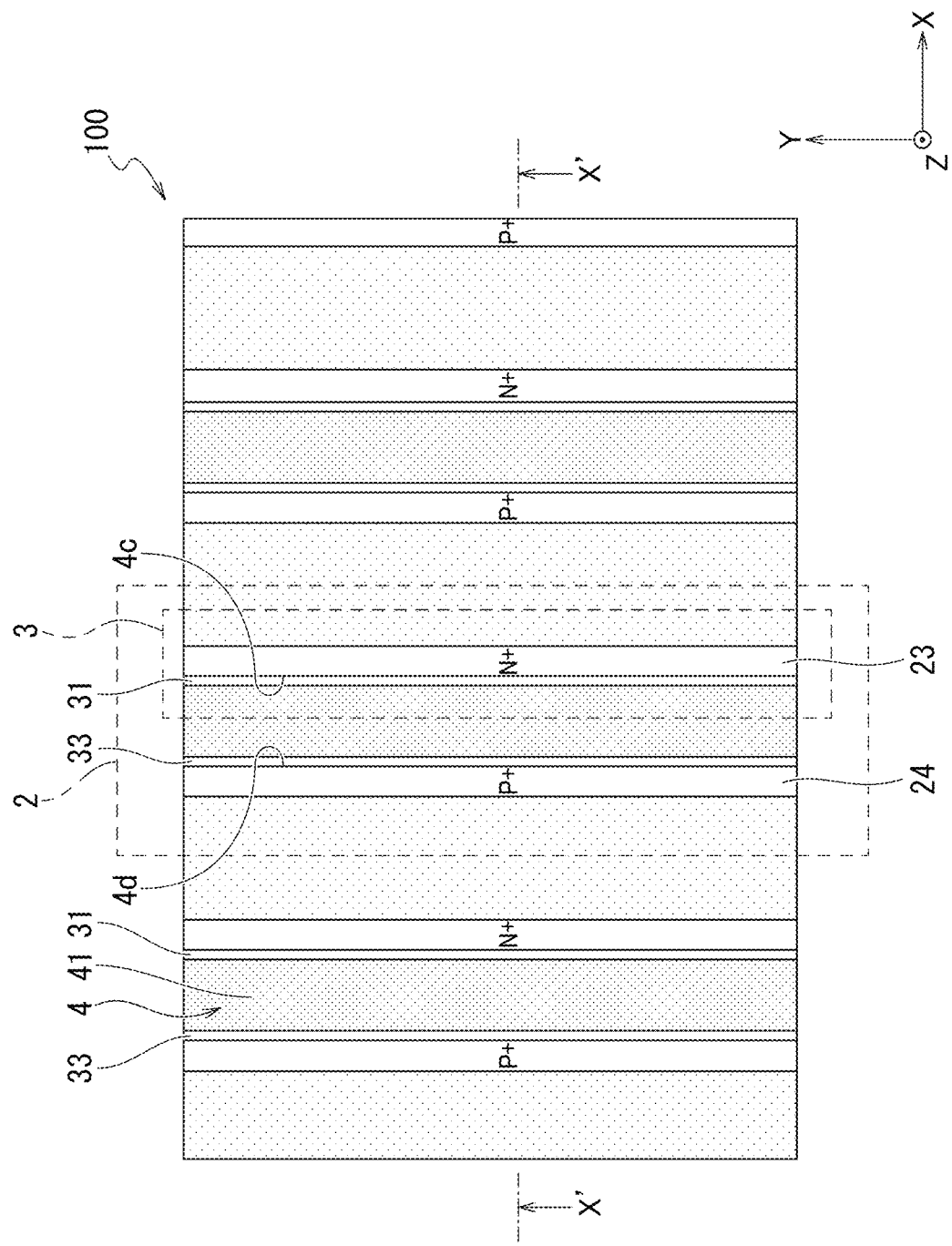
FIG. 1 is a plan view illustrative of a configuration example of a GaN semiconductor device according to a first embodiment of the present invention.

Embodiments of the present invention will be described below. In the following description of the drawings, the same or similar portions are denoted by the same or similar reference numerals. However, it should be noted that the drawings are schematic and a relation between a thickness and a flat dimension, a ratio of thicknesses of respective devices or members, and the like are different from actual ones. Accordingly, specific thicknesses and dimensions should be determined with reference to the following description. In addition, it is certain that some portions have different dimensional relations and ratios between the drawings.

In the following description, description relating to directions are sometimes made using wording such as "X-axis direction", "Y-axis direction", and "Z-axis direction". For example, the X-axis direction and the Y-axis direction are directions parallel with one surface 20a (an example of a "first principal surface" of the present invention) of a GaN layer 20, which will be described later. The Z-axis direction is a direction perpendicularly intersecting the one surface 20a. The X-axis direction, the Y-axis direction, and the Z-axis direction intersect one another at right angles. In the following description, the term "as viewed in plan" means viewing from the Z-axis direction.

In the following description, the positive direction and the negative direction of the Z-axis are sometimes referred to as "upper" and "lower", respectively. The "upper" and the "lower" do not necessarily mean the vertical directions with respect to the ground surface. In other words, the directions to "upper" and "lower" are not limited to the directions of gravitational force. The "upper" and the "lower" are nothing more than expressions for the sake of convenience to specify relative positional relations in a region, a layer, a film, a substrate, or the like, and do not limit a technological concept of the present invention. For example, it is needless to say that, when the plane of paper is rotated 180 degrees, "upper" and "lower" are exchanged with "lower" and "upper", respectively.

The following description will be exemplarily made on a case where a first conductivity type and a second conductivity type are a P-type and an N-type, respectively. However, by choosing the conductivity types in an opposite manner, the first conductivity type and the second conductivity type may be set as the N-type and the P-type, respectively. Signs + and − attached to P or N indicate that semiconductor regions to the conductivity types of which the signs + and − are attached are semiconductor regions the impurity concentrations of which are relatively higher and lower than another semiconductor region to the conductivity type of which neither + nor − is attached, respectively. However, two semiconductor regions having the same conductivity type P (or the same conductivity type N) assigned thereto does not necessarily mean that impurity concentrations of the semiconductor regions are exactly the same.

First Embodiment

Configuration Example

Figure 2:
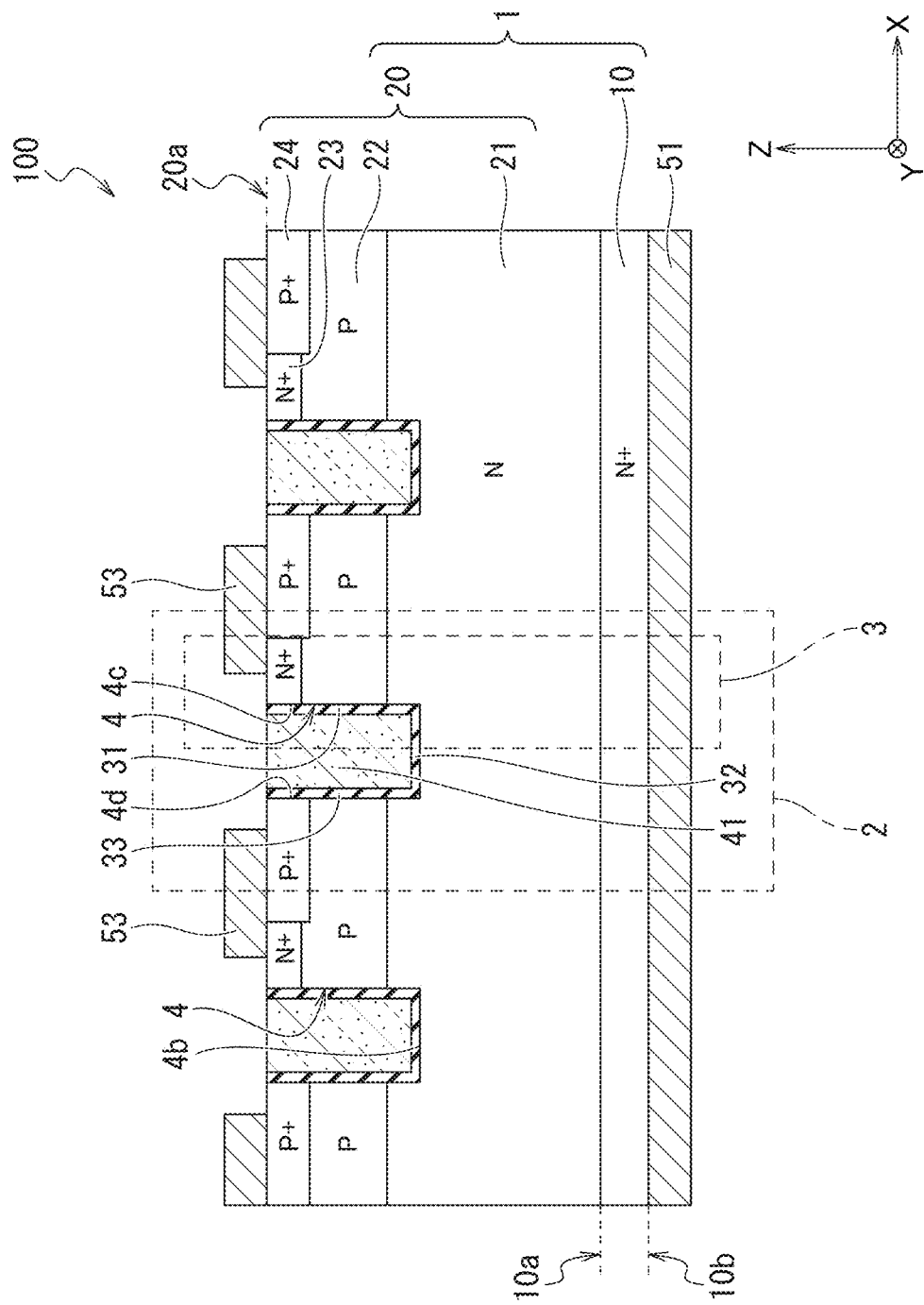
FIG. 2 is a cross-sectional view illustrative of the configuration example of the GaN semiconductor device according to the first embodiment of the present invention.

FIG. 1 is a plan view illustrative of a configuration example of a gallium nitride semiconductor device (hereinafter, referred to as a GaN semiconductor device, an example of a "nitride semiconductor device" of the present invention) 100 according to a first embodiment of the present. FIG. 2 is a cross-sectional view illustrative of the configuration example of the GaN semiconductor device 100 according to the first embodiment of the present invention. FIG. 2 illustrates a cross-section of FIG. 1 taken along the line X'-X' thereof.

The GaN semiconductor device 100 illustrated in FIGS. 1 and 2 includes a gallium nitride substrate (hereinafter, referred to as a GaN substrate) 1 and unit structures 2 formed in the GaN substrate 1. In the GaN semiconductor device 100, the unit structures 2 are repeatedly formed in one direction (For example, the X-axis direction). In each of the unit structures 2, a trench 4 formed in the GaN substrate 1 and a vertical MOSFET (an example of a "field effect transistor" of the present invention) 3 the channel of which is formed on the side on which a first side surface 4c of the trench 4 is located in the X-axis direction are included.

The GaN substrate 1 includes a GaN single crystal substrate 10 and a GaN layer 20 formed on one surface 10a (in FIG. 2, an upper surface) of the GaN single crystal substrate 10. The GaN single crystal substrate 10 is an N-type (an example of a "second conductivity type" of the present invention) substrate, and is, for example, an N+-type substrate. N-type impurities contained in the GaN single crystal substrate 10 are one or more types of elements among silicon (Si), oxygen (O), and germanium (Ge). To cite an example, N-type impurities contained in the GaN single crystal substrate 10 are Si or O, and impurity concentration of Si or O in the GaN single crystal substrate 10 is $2\times10^{18}$ cm$^{-3}$ or more.

The one surface 10a of the GaN single crystal substrate 10 is a non-polar plane (for example, an m-plane or an a-plane). The m-plane is a (10-10) plane. The a-plane is a (11-20) plane. The a-plane or the m-plane perpendicularly intersects a c-plane, which is a polar plane. The c-plane is a (0001) plane.

Note that the GaN single crystal substrate 10 may be a low dislocation free-standing substrate the dislocation density of which is less than $1\times10^7$ cm$^{-2}$. The GaN single crystal substrate 10 being a low dislocation free-standing substrate causes dislocation density of the GaN layer 20 formed on the GaN single crystal substrate 10 to be also low. Even when a power device having a large area is formed in the GaN substrate 1, use of a low dislocation free-standing substrate as the GaN single crystal substrate 10 enables leakage current in the power device to be reduced. This capability enables manufacturing apparatuses to manufacture power devices with a high yield rate. It is also possible to prevent ion-implanted impurities from deeply diffusing along dislocations in heat treatment.

The GaN layer 20 is a GaN single crystal layer that is epitaxially formed on the one surface 10a, which is a non-polar plane of the GaN single crystal substrate 10. The GaN layer 20 being epitaxially formed on the non-polar plane causes the one surface 20a (in FIG. 2, an upper surface) of the GaN layer 20 to also become a non-polar plane.

In the GaN layer 20, an N-type impurity region 21 (an example of a "second impurity region" of the present invention), P-type well regions 22, N+-type source regions 23, and P+-type high concentration regions 24 (an example of a "first impurity region" of the present invention) are formed. A portion of the N-type impurity region 21, a portion of a P-type well region 22, and an N+-type source region 23 are constituent components of each of the vertical MOSFETs 3.

The impurity region 21 functions as a drift region between the GaN single crystal substrate 10 and the well regions 22 in the vertical MOSFETs 3. The impurity region 21 is formed by N-type impurities (such as Si) being doped in the process of epitaxial growth to form the GaN layer 20. The impurity region 21 has a lower N-type impurity concentration than the GaN single crystal substrate 10 and the source regions 23. For example, concentration of N-type impurities contained in the impurity region 21 is $1\times10^{15}$ cm$^{-3}$ or more and $5\times10^{16}$ cm$^{-3}$ or less. Although, in the impurity region 21, distance (thickness) between the GaN single crystal substrate 10 and the well regions 22 can be arbitrarily set depending on breakdown voltage that the vertical MOSFETs 3 are required to have, the distance, to cite an example, is approximately 10 μm at a breakdown voltage of 1200 V.

The well regions 22 are formed by P-type impurities (such as magnesium (Mg)) being doped with a concentration of approximately $1\times10^{17}$ cm$^{-3}$ or more and $1\times10^{18}$ cm$^{-3}$ or less in the process of epitaxial growth to form the GaN layer 20. Alternatively, the well regions 22 may be formed by P-type impurities being ion-implanted from the one surface 20a of the GaN layer 20 to a predetermined depth and the GaN layer 20 being heat-treated. In each of the well regions 22, a channel of a vertical MOSFET 3 is formed in a portion in contact with a gate insulating film 31 and a vicinity of the portion.

The source regions 23 are formed on the one surface 20a side of the GaN layer 20 and are in contact with the well regions 22 in the Z-axis direction. The source regions 23 may be formed by N-type impurities (such as Si) being ion-implanted from the one surface 20a of the GaN layer 20 to a predetermined depth and the GaN layer 20 being heat-treated. As illustrated in FIG. 1, each of the source regions 23 is arranged in a stripe shape as viewed in plan.

For example, the source regions 23 are extended in the Y-axis direction and are arranged at a constant interval in the X-axis direction.

As illustrated in FIG. 2, each of the trenches 4 is formed from the one surface 20a of the GaN layer 20 to the side on which the other surface 10b (that is, a surface on the opposite side to the one surface 10a, and an example of a "second principal surface" of the present invention) of the GaN single crystal substrate 10 is located. Each of the trenches 4 opens to the one surface 20a side of the GaN layer 20 and has a bottom surface 4b reaching the impurity region 21. As illustrated in FIG. 1, each of the trenches 4 is arranged in a stripe shape as viewed in plan. For example, the trenches 4 are extended in the Y-axis direction and are arranged at a constant interval in the X-axis direction.

Each of the trenches 4 is formed by etching the one surface 20a, which is a non-polar plane, of the GaN layer 20 in the vertical direction in the GaN layer 20. This etching causes, among side surfaces formed on the inner side of the trench 4, the first side surface 4c to be a nitrogen face (hereinafter, referred to as an N face) in the surface layer of which nitrogen atoms are located and a second side surface 4d that faces the first side surface 4c in the X-axis direction to be a gallium face (hereinafter, referred to as a Ga face) in the surface layer of which gallium atoms are located. Both the first side surface 4c, which is an N face, and the second side surface 4d, which is a Ga face, are perpendicular to the one surface 20a of the GaN layer 20.

Each of the vertical MOSFETs 3 includes agate insulating film 31 formed on a first side surface 4c, which is an N face, and a gate electrode 41 formed inside a trench 4 and covering the gate insulating film 31. The gate insulating film 31 is made of, for example, a silicon oxide film ($SiO_2$ film), an aluminum oxide ($Al_2O_3$) film, or a mixed film thereof. The gate electrode 41 is made of, for example, polysilicon (Poly-Si) into which impurities are doped. Thickness of the gate insulating film 31 is, for example, 50 nm or more and 100 nm or less.

Note that, on the bottom surface 4b of each of the trenches 4, an insulating film 33 is formed. On the second side surface 4d of the trench 4, which is a Ga face, an insulating film 33 is formed. The gate insulating film 31 and the insulating films 32 and 33 are formed at the same time by, for example, depositing a silicon oxide film ($SiO_2$ film) or an aluminum oxide ($Al_2O_3$) film by a chemical vapor deposition (CVD) method with inside surfaces (the bottom surface 4b, the first side surface 4c, which is an N face, and the second side surface 4d, which is a Ga face) of the trench 4 exposed. Thickness of the insulating films 32 and 33 is, for example, the same thickness as the gate insulating film 31.

The vertical MOSFETs 3 have a drain electrode 51 formed on the other surface 10b side of the GaN single crystal substrate 10. The drain electrode 51 forms an ohmic junction with the GaN single crystal substrate 10. The drain electrode 51 is made of, for example, aluminum (Al) or Al alloy, such as Al—Si and Ti—Al.

Each of the vertical MOSFETs 3 has a source electrode 53 formed on the one surface 20a side of the GaN layer 20. Each of the source electrodes 53 forms ohmic junctions with both an $N^+$-type source region 23 and a $P^+$-type high concentration region 24. As illustrated in FIG. 1, each of the source electrodes 53 is arranged in a stripe shape as viewed in plan. For example, the source electrodes 53 are extended in the Y-axis direction and are arranged at a constant interval in the X-axis direction. The source electrodes 53 are made of, for example, Al or Al alloy, such as Al—Si and Ti—Al. Each of the source electrodes 53 may have barrier metal, such as titanium nitride (TiN), between the source electrode 53 and the one surface 20a of the GaN layer 20.

In the GaN semiconductor device 100, a P-type well region 22 and an $N^+$-type source region 23 are formed in a region adjacent to each of the first side surfaces 4c, which are N faces. In the GaN semiconductor device 100, this configuration causes drain current of each of the vertical MOSFETs 3 to flow by way of a first side surface 4c, which is an N face, and a vicinity thereof.

In the GaN semiconductor device 100, no $N^+$-type source region 23 is formed in regions adjacent to the second side surfaces 4d, which are Ga faces. In a region adjacent to each of the second side surfaces 4d, which are Ga faces, a $P^+$-type high concentration region 24, in which P-type impurity concentration is higher than the well regions 22, is formed. In the $P^+$-type high concentration region 24, no channel of a vertical MOSFET 3 is formed. Thus, drain current of each of the vertical MOSFETs 3 does not flow in a second side surface 4d, which is a Ga face, and a vicinity thereof.

As described later, in a GaN layer, interface state density on the valence band side at an N face is lower than at a Ga face. While the higher is interface state density on the valence band side, the more likely are positive charges (holes) to be trapped and are switching characteristics of a MOSFET to be reduced, a channel is formed in an N face, at which interface state density on the valence band side is low, and a vicinity thereof in a vertical MOSFET 3 according to the first embodiment of the present invention. In a Ga face, at which interface state density on the valence band side is comparatively high, and a vicinity thereof, no channel is formed. The characteristics enable the vertical MOSFETs 3 to achieve excellent switching characteristics.

(Interface State Density)

(1) Interface Between N Face of GaN Layer and $SiO_2$ Film

Figure 3A:
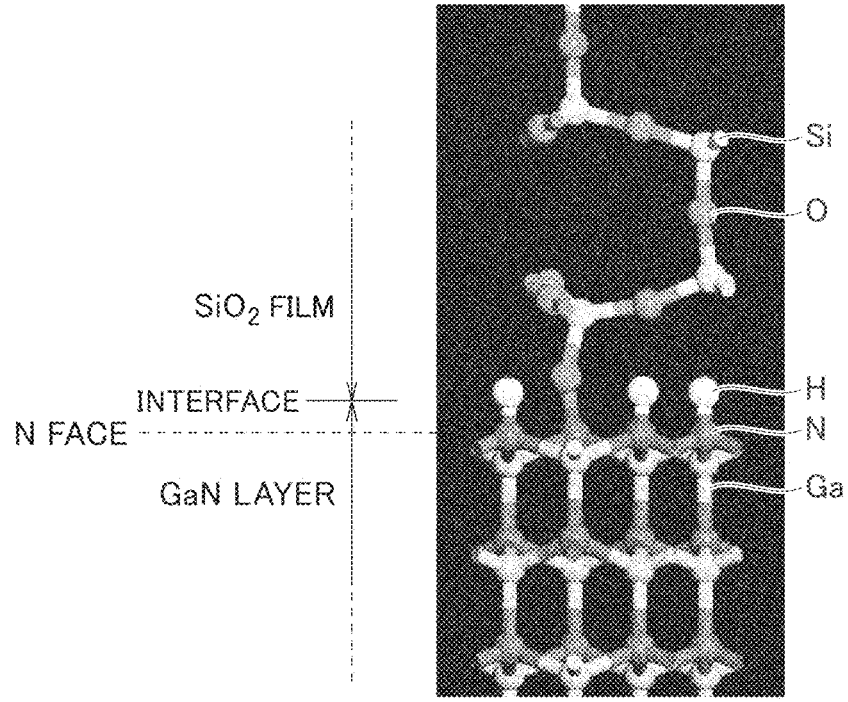
FIG. 3A is a model diagram illustrative of bonding states of atoms in a vicinity of an interface between an N face of a GaN layer and a $SiO_2$ film.

FIG. 3A is a model diagram illustrative of bonding states of atoms in a vicinity of an interface between an N face of a GaN layer and a $SiO_2$ film. As illustrated in FIG. 3A, N atoms are arranged on the N face of the GaN layer. A large part of N atoms are bonded to oxygen (O) atoms of the $SiO_2$ film. At the interface between the N face of the GaN layer and the $SiO_2$ film, the dangling bond of an N atom is terminated by, for example, a hydrogen (H) atom.

Figure 3B:
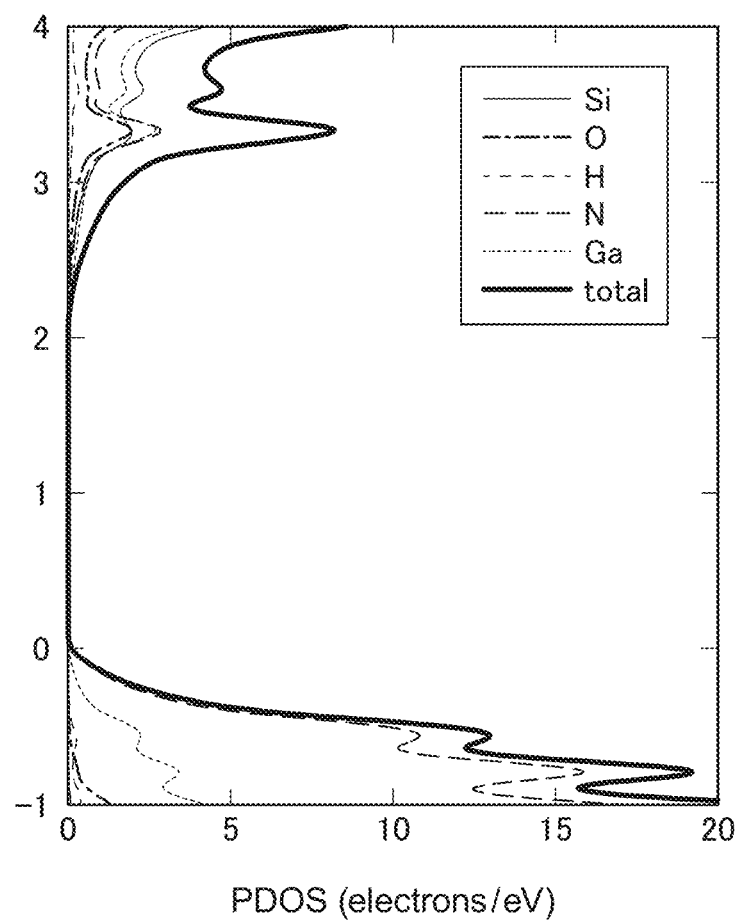
FIG. 3B is a diagram illustrative of density of states of a band structure at the interface between the N face of the GaN layer and the $SiO_2$ film.
Figure 3C:
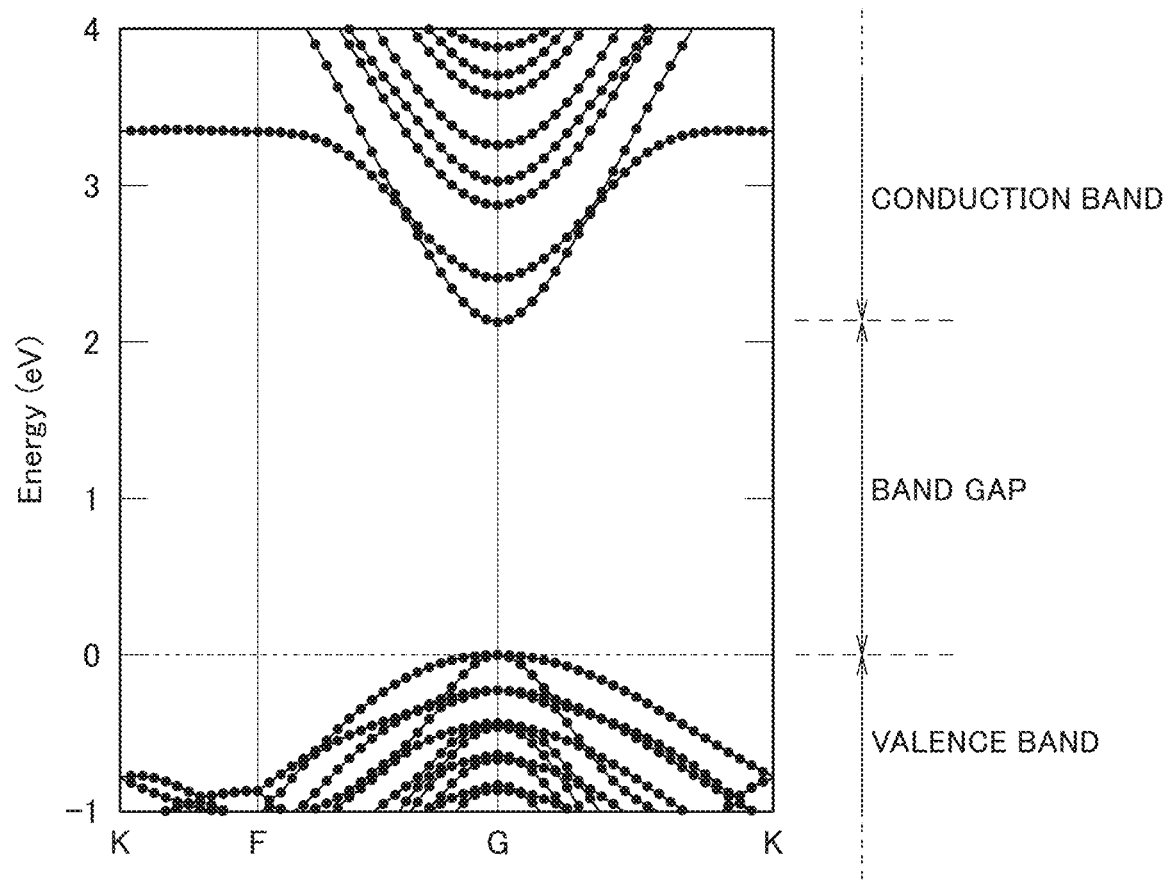
FIG. 3C is a diagram illustrative of a band gap at the interface between the N face of the GaN layer and the $SiO_2$ film.

FIG. 3B is a diagram illustrative of density of states in bands at the interface between the N face of the GaN layer and the $SiO_2$ film. The ordinate and the abscissa in FIG. 3B represent energy (eV) and density of states, respectively. FIG. 3C is a diagram illustrative of a band gap at the interface between the N face of the GaN layer and the $SiO_2$ film.

As illustrated in FIGS. 3B and 3C, at the interface at which the N face and the $SiO_2$ film are in contact with each other, the potential of O atoms on the valence band side is deep and a level originating from the Ga—O bond cannot be observed close to the top of the valence band, compared with an interface at which the Ga face and the $SiO_2$ film are in contact with each other, which will be described later. It is expected that, at the interface at which the N face and the $SiO_2$ film are in contact with each other, interface states on the valence band side are held low.

(2) Interface Between Ga Face of GaN Layer and $SiO_2$ Film

Figure 4A:
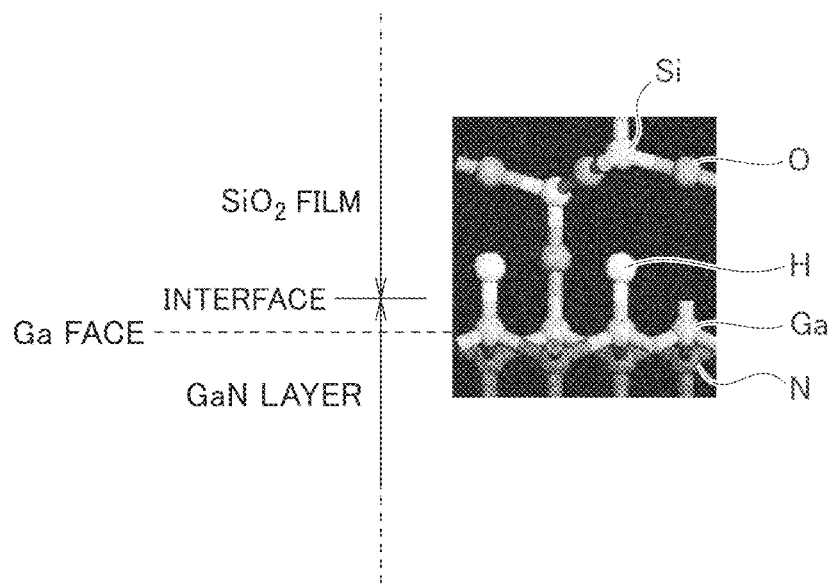
FIG. 4A is a model diagram illustrative of bonding states of atoms in a vicinity of an interface between an Ga face of the GaN layer and a $SiO_2$ film.

FIG. 4A is a model diagram illustrative of bonding states of atoms in a vicinity of an interface between a Ga face of a GaN layer and a $SiO_2$ film. As illustrated in FIG. 4A, Ga atoms are arranged on the Ga face of the GaN layer. A large part of Ga atoms are bonded to oxygen (O) atoms of the $SiO_2$ film. At the interface between the Ga face of the GaN layer and the SiO$_2$ film, the dangling bond of a Ga atom is terminated by, for example, a hydrogen (H) atom.

Figure 4B:
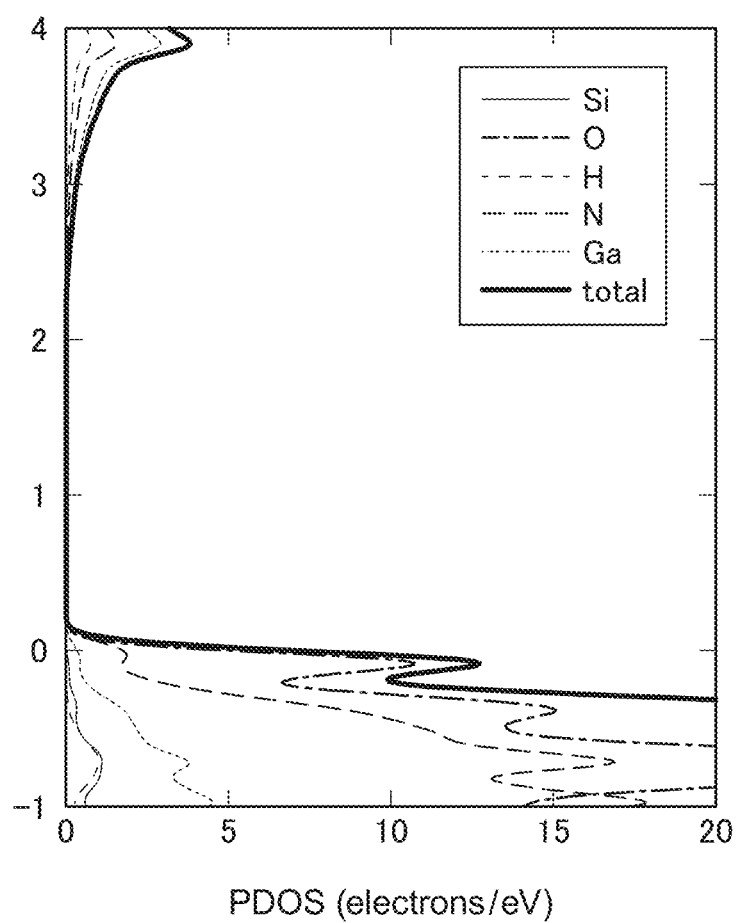
FIG. 4B is a diagram illustrative of density of states of a band structure at the interface between the Ga face of the GaN layer and the $SiO_2$ film.

FIG. 4B is a diagram illustrative of density of states in bands at the interface between the Ga face of the GaN layer and the SiO$_2$ film. The ordinate and the abscissa in FIG. 4B represent energy (eV) and density of states, respectively. FIG. 4C is a diagram illustrative of a band gap at the interface between the Ga face of the GaN layer and the SiO$_2$ film.

As illustrated in FIGS. 4B and 4C, at the interface at which the Ga face and the SiO$_2$ film are in contact with each other, a certain density of states of oxygen (O) atoms appears in a vicinity of the top of the valence band and a level originating from the Ga—O bond can be observed, on the valence band side. It is considered that the level originating from the Ga—O bond is interface states serving as the origin of hole traps.

As described in the foregoing, the GaN semiconductor device 100 according to the first embodiment of the present invention has the one surface 20a and the other surface 10b located on the opposite side to the one surface 20a, and includes the GaN substrate 1 having the trenches 4 formed from the one surface 20a to the other surface 10b side and the vertical MOSFETs 3 formed in the GaN substrate 1. Each of the trenches 4 has a first side surface 4c and a second side surface 4d. The first side surface 4c is the N face in the surface layer of which nitrogen (N) atoms are located. The second side surface 4d is the gallium face in the surface layer of which gallium (Ga) atoms are located. Each of the vertical MOSFETs 3 includes a gate insulating film 31 formed on the first side surface 4c of the vertical MOSFET 3 and a gate electrode 41 formed inside a trench 4 and covering the gate insulating film 31.

According to this configuration, the channel of each of the vertical MOSFETs 3 is formed in an N face, at which interface state density on the valence band side is low, and a vicinity thereof. In a Ga face, at which interface state density on the valence band side is comparatively high, and a vicinity thereof, the channel of a MOSFET is not formed. This configuration enables the GaN semiconductor device 100 to suppress charges (for example, holes) from being trapped in interface states on the valence band side in a region in which a channel is formed, and it is therefore possible to reduce variation in switching characteristics.

Advantageous effects of the embodiment will be described in more detail. Switching characteristics of a MOSFET vary according to charges trapped in interface states in a region in which the channel is formed. The interface state density of a GaN layer is low on the conduction band side but high on the valence band side. A high interface state density on the valence band side causes charges accumulated at the interface between a GaN layer and a gate insulating film to be temporarily trapped, which causes the switching characteristics to deteriorate.

It has been known that a GaN layer has an N face in the surface layer of which N atoms are located and a Ga face in the surface layer of which Ga atoms are located. The interface state density on the valence band side at the N face is lower than that at the Ga face. Forming the channel of a MOSFET at the N face, at which interface state density on the valence band side is low, enables charges to be suppressed from being trapped and variation in switching characteristics of the MOSFET to be reduced.

However, when the N face is epitaxially grown, the amount of impurity incorporation, such as Si and O, increases. As such, a method of epitaxially growing the N face involves difficulty in concentration control of the GaN layer, and it is impractical to apply the method to a power device, in which concentration control of a drift region is required.

In contrast, in the embodiment of the present invention, instead of forming an N face of a GaN layer by epitaxial growth, a non-polar plane (for example, an m-plane or an a-plane) of the GaN layer 20 is formed by epitaxial growth. The one surface 20a of the GaN layer 20 illustrated in FIG. 2 is a non-polar plane. By etching the one surface 20a, which is a non-polar plane, in the vertical direction, an N face is formed on a portion (first side surface 4c) of the inner side surface of each of the trenches 4 of the GaN layer 20. Since the amount of impurity incorporation in epitaxial growth of a non-polar plane is smaller than that in epitaxial growth of an N face, concentration control of P-type impurities and N-type impurities in the GaN layer 20 is easy and the method of the embodiment can thus be applied to a power device.

Etching a non-polar plane in the vertical direction causes an N face to be formed on the first side surface 4c of each of the trenches 4 and, in conjunction therewith, a Ga face to be formed on the second side surface 4d of each of the trenches 4. In the embodiment of the present invention, in consideration of interface state density on the valence band side being comparatively high at the Ga face, it is configured such that the channel of each of the vertical MOSFETs 3 is formed only in a first side surface 4c, which is an N face, and a vicinity thereof.

Because of this configuration, the embodiment of the present invention enables a nitride semiconductor device in which the amount of impurity incorporation into the GaN layer 20 is small and concentration control of P-type impurities and N-type impurities in the GaN layer 20 is easy and that is applicable to a power device and excels in switching characteristics of the vertical MOSFETs 3 to be provided.

Second Embodiment

Figure 5:
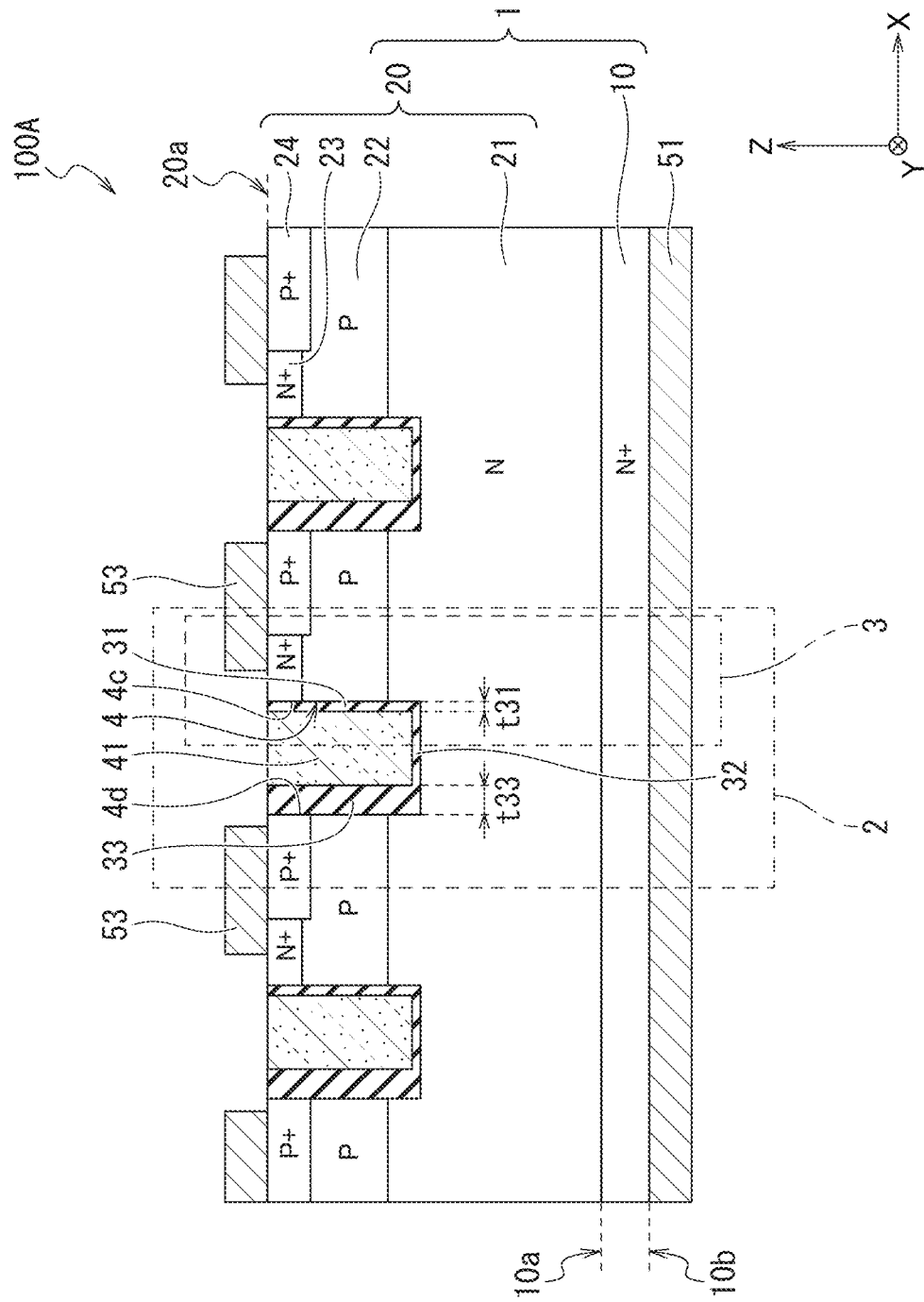
FIG. 5 is a cross-sectional view illustrative of a configuration of a GaN semiconductor device according to a second embodiment of the present invention.

FIG. 5 is a cross-sectional view illustrative of a configuration of a GaN semiconductor device 100A according to a second embodiment of the present invention. The GaN semiconductor device 100A illustrated in FIG. 5 differs from the GaN semiconductor device 100 illustrated in FIG. 2 in that each insulating film 33 formed on a second side surface 4d, which is a Ga face, is formed thick. In the GaN semiconductor device 100A, when thickness of each gate insulating film 31 and thickness of each insulating film 33 are denoted by t31 and t33, respectively, the thickness t33 has a larger value than the thickness t31 (t31<t33). For example, while the thickness t31 of each of the gate insulating films 31 is 50 nm or more and 100 nm or less, the thickness t33 of each of the insulating films 33 is greater than 100 nm and 400 nm or less.

The GaN semiconductor device 100A, as with the GaN semiconductor device 100 illustrated in FIG. 2, has the channel of each vertical MOSFET 3 formed on the first side surface 4c side, the first side surface 4c being an N face, and no channel formed on the second side surface 4d side, the second side surface 4d being a Ga face. This configuration enables the GaN semiconductor device 100A to attain the same advantageous effects as the GaN semiconductor device 100. The GaN semiconductor device 100A is also capable of, in each of the vertical MOSFETs 3, reducing capacitance generated between a gate electrode 41 and a well region 22 with the insulating film 33 interposed therebetween, through thickening of the insulating film 33. This capability enables the GaN semiconductor device 100A to further speed up operation of switching on and off each vertical MOSFET 3.

Third Embodiment

Figure 6:
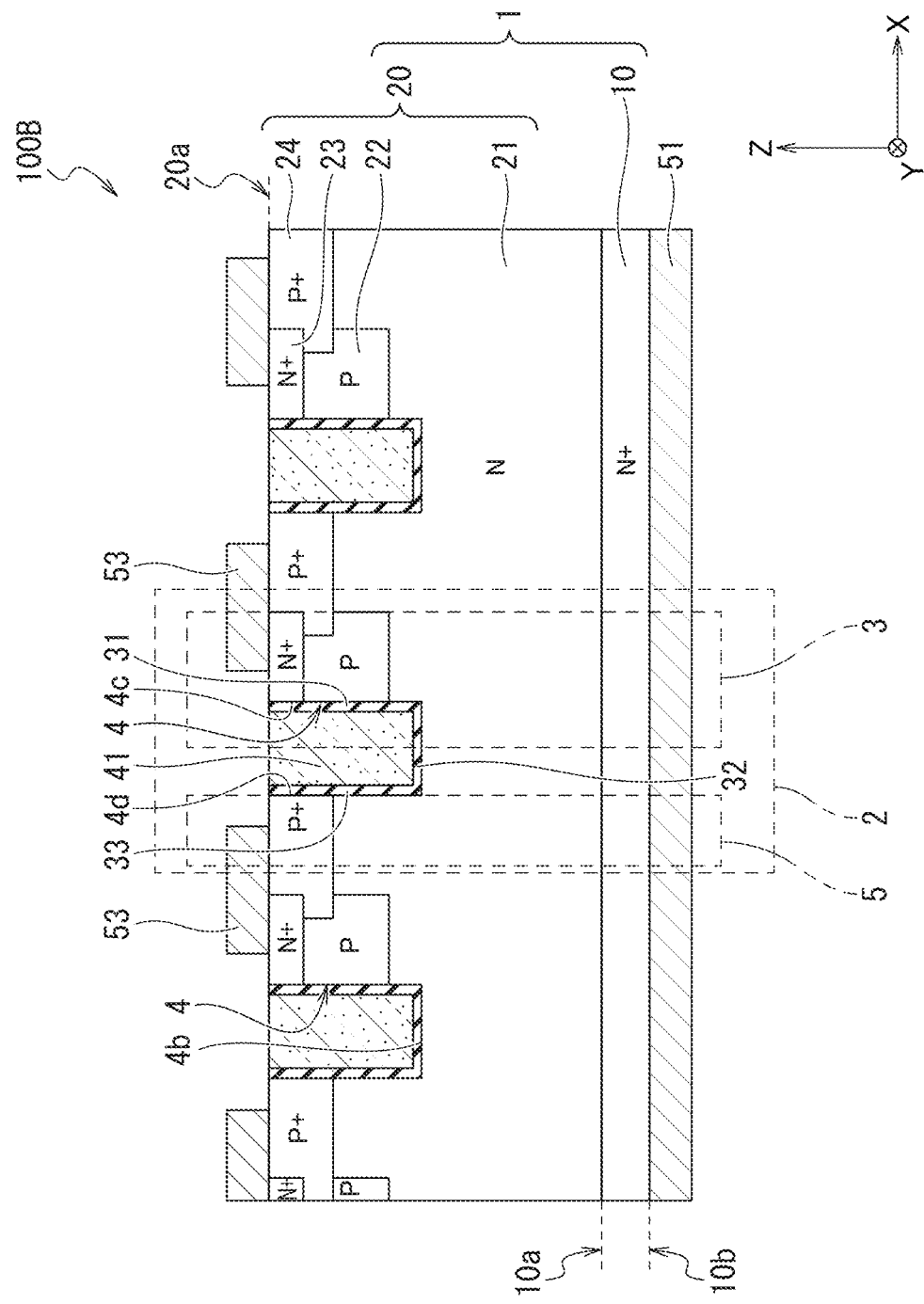
FIG. 6 is a cross-sectional view illustrative of a configuration of a GaN semiconductor device according to a third embodiment of the present invention.

FIG. 6 is a cross-sectional view illustrative of a configuration of a GaN semiconductor device 100B according to a third embodiment of the present invention. The GaN semiconductor device 100B illustrated in FIG. 6 differs from the GaN semiconductor device 100 illustrated in FIG. 2 in that resistance of each internal diode formed between a source electrode 53 and a drain electrode 51 is reduced. The GaN semiconductor device 100B includes, as a portion of each internal diode, a PN junction diode 5 arranged in a region adjacent to a second side surface 4d, which is a Ga face. Each of the PN junction diodes 5 has a P-type region constituted only by a P+-type high concentration region 24 and the P+-type high concentration region 24 and an N-type impurity region 21 forming a PN junction with each other.

The GaN semiconductor device 100B, as with the GaN semiconductor device 100 illustrated in FIG. 2, has the channel of each vertical MOSFET 3 formed on the first side surface 4c side, the first side surface 4c being an N face, and no channel formed on the second side surface 4d side, the second side surface 4d being a Ga face. This configuration enables the GaN semiconductor device 100B to attain the same advantageous effects as the GaN semiconductor device 100. The GaN semiconductor device 100B also includes, as a portion of each internal diode, the PN junction diode 5 in which the Pt-type high concentration region 24 and the N-type impurity region 21 form a PN junction with each other. This configuration enables the GaN semiconductor device 100B to practically increase diode area of each internal diode (that is, area of a PN junction surface) and reduce resistance of the internal diode.

Fourth Embodiment

Figure 7:
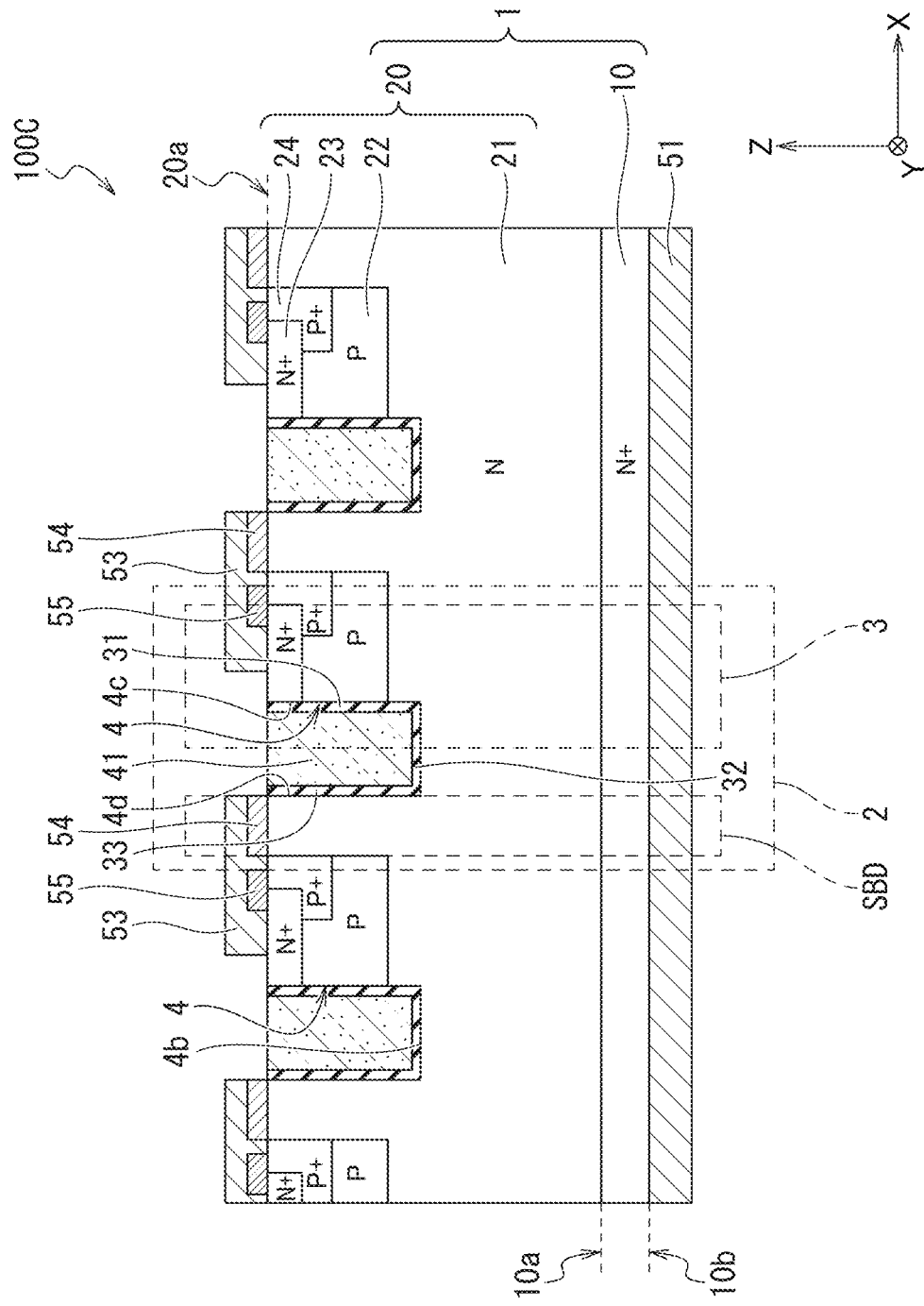
FIG. 7 is a cross-sectional view illustrative of a configuration of a GaN semiconductor device according to a fourth embodiment of the present invention.

FIG. 7 is a cross-sectional view illustrative of a configuration of a GaN semiconductor device 100C according to a fourth embodiment of the present invention. The GaN semiconductor device 100C illustrated in FIG. 7 differs from the GaN semiconductor device 100 illustrated in FIG. 2 in including, as a portion of each of internal diodes formed between source electrodes 53 and a drain electrode 51, a Schottky barrier diode SBD that is arranged in a region adjacent to a second side surface 4d, which is a Ga face.

As illustrated in FIG. 7, in the GaN semiconductor device 100C, no P-type well region 22 is arranged in regions adjacent to the second side surfaces 4d, which are Ga faces. In these regions, portions of an N-type impurity region 21 are arranged. The GaN semiconductor device 100C also includes a Schottky junction electrode 54 as a portion of each of the Schottky barrier diodes SBD. Each of the Schottky junction electrodes 54 forms a Schottky junction with the N-type impurity region 21 at one surface 20a of a GaN layer 20. Each of the Schottky junction electrodes 54 is covered by a source electrode 53 and forms a junction with the source electrode 53.

Each of the Schottky junction electrodes 54 is made of metal forming a Schottky junction with an N-type GaN layer. Examples of the metal forming a Schottky junction with an N-type GaN layer include nickel (Ni). The metal of which each of the Schottky junction electrode 54 is made is not limited to Ni and may be another metal, as long as the metal is a metal forming a Schottky junction with the N-type GaN layer.

The GaN semiconductor device 100C may have ohmic junction electrodes 55 in addition to the Schottky junction electrodes 54. Each of the ohmic junction electrodes 55 forms an ohmic junction with a P+-type high concentration region 24 at the one surface 20a of the GaN layer 20. Each of the ohmic junction electrodes 55 is covered by a source electrode 53 and forms a junction with the source electrode 53. Each of the ohmic junction electrodes 55 is capable of improving ohmic characteristics of a connection between a P+-type high concentration region 24 and a source electrode 53.

Each of the ohmic junction electrodes 55 is made of metal forming an ohmic junction with a P-type GaN layer. Examples of the metal forming an ohmic junction with a P-type GaN layer include Ni. Ni forms a Schottky junction with an N-type GaN layer and forms an ohmic junction with a P-type GaN layer. The metal of which each of the ohmic junction electrodes 55 is made is not limited to Ni and may be another metal, as long as the metal is a metal forming an ohmic junction with the P-type GaN layer.

As illustrated in FIG. 7, the Schottky junction electrodes 54 and the ohmic junction electrodes 55 are arranged in line in the X-axis direction in an X-Z cross-section of the GaN semiconductor device 100C taken along an X-Z plane. In this case, a source electrode 53 is interposed between each pair of a Schottky junction electrode 54 and an ohmic junction electrode 55.

(Variation)

Figure 8A:
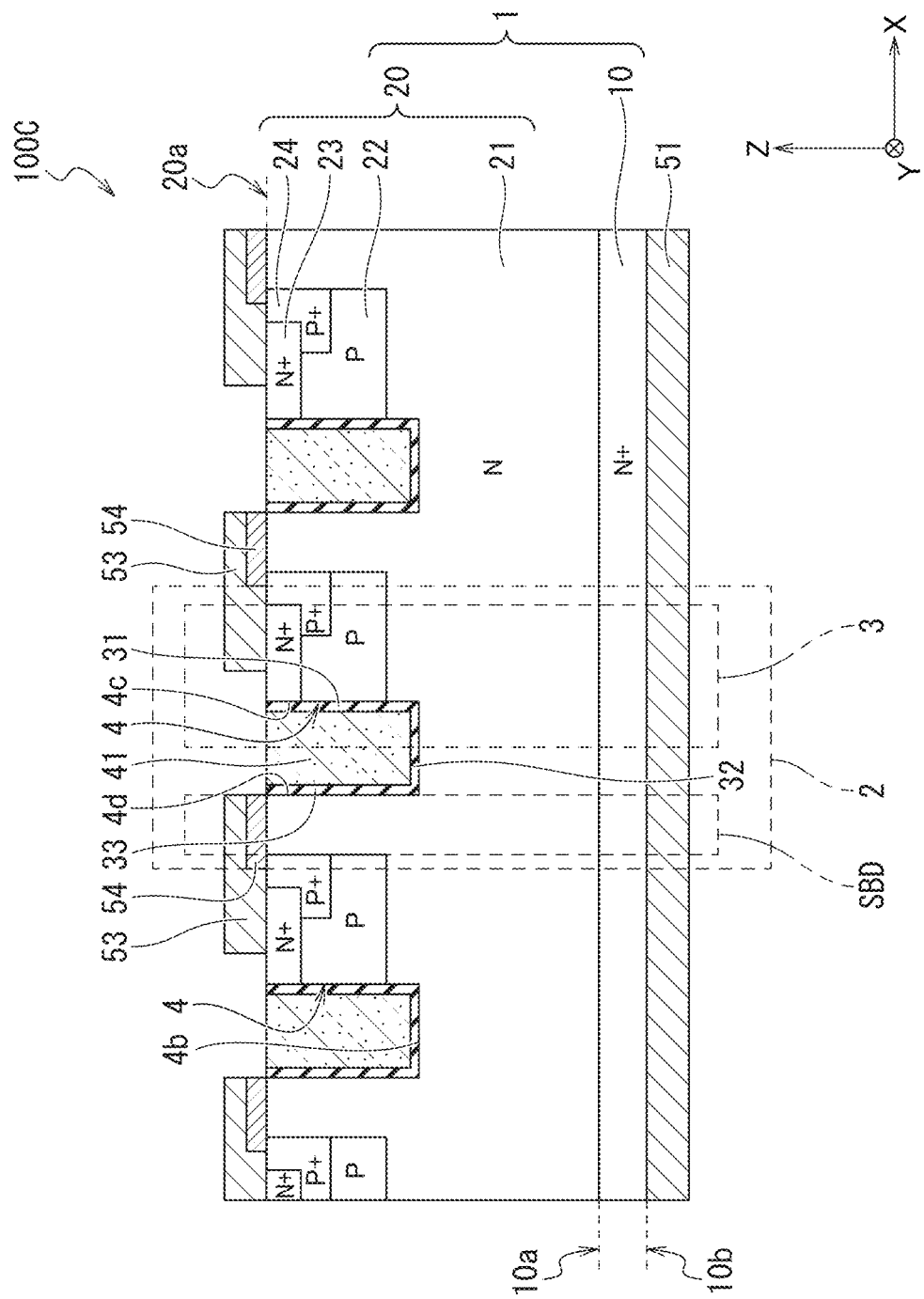
FIG. 8A is a cross-sectional view illustrative of a variation of the GaN semiconductor device according to the fourth embodiment of the present invention.
Figure 8B:
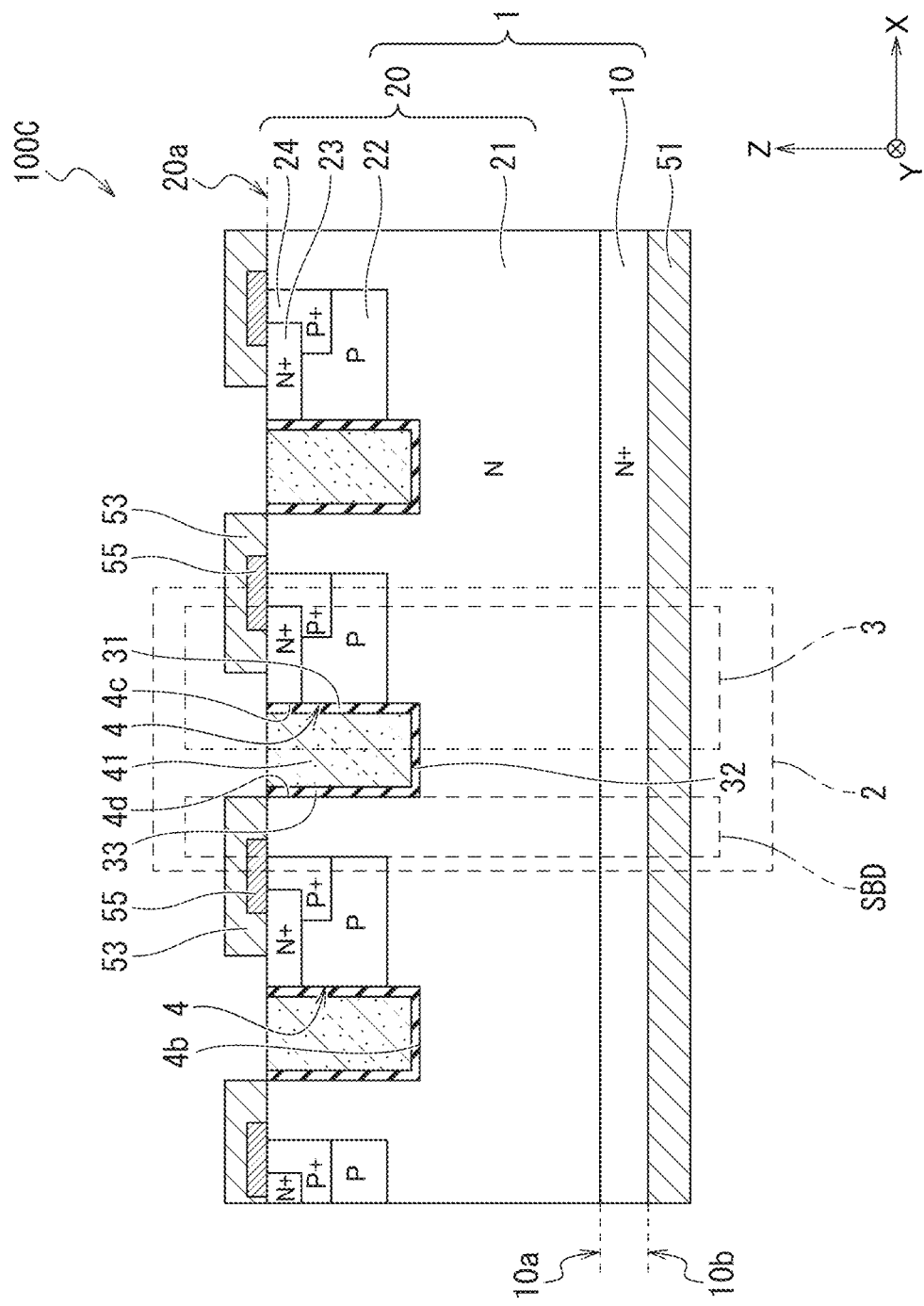
FIG. 8B is another cross-sectional view illustrative of the variation of the GaN semiconductor device according to the fourth embodiment of the present invention.

The Schottky junction electrodes 54 and the ohmic junction electrodes 55 may be alternately arranged in line in the Y-axis direction (in FIG. 7, a direction perpendicularly intersecting the plane of paper). FIGS. 8A and 8B are cross-sectional views illustrative of a variation of the GaN semiconductor device 100C according to the fourth embodiment of the present invention. FIG. 8A illustrates a cross-section of the GaN semiconductor device 100C taken along a first X-Z plane passing through the Schottky junction electrodes 54. FIG. 8B illustrates a cross-section of the GaN semiconductor device 100C taken along a second X-Z plane passing through the ohmic junction electrodes 55.

As illustrated in FIG. 8A, in the cross-section of the GaN semiconductor device 100C taken along the first X-Z plane, the Schottky junction electrodes 54, among the Schottky junction electrodes 54 and the ohmic junction electrodes 55, appear. In this cross-section, portions of the Schottky junction electrodes 54 may form junctions with the P+-type high concentration regions 24.

As illustrated in FIG. 8B, in the cross-section of the GaN semiconductor device 100C taken along the second X-Z plane, the ohmic junction electrodes 55, among the Schottky junction electrodes 54 and the ohmic junction electrodes 55, appear. In this cross-section, portions of the ohmic junction electrodes 55 may form junctions with the impurity region 21.

The GaN semiconductor device 100C, as with the GaN semiconductor device 100 illustrated in FIG. 2, has the channel of each vertical MOSFET 3 formed on the first side surface 4c side, the first side surface 4c being an N face, and no channel formed on the second side surface 4d side, the second side surface 4d being a Ga face. This configuration enables the GaN semiconductor device 100C to attain the same advantageous effects as the GaN semiconductor device 100. The GaN semiconductor device 100C includes a Schottky barrier diode SBD as a portion of each of the internal diodes. Regarding the Schottky barrier diodes SBD, selection of a type of metal of which the Schottky junction electrodes 54 are made enables forward voltage of the Schottky barrier diodes SBD to be adjusted to a desired value. This capability enables internal diodes in the GaN semiconductor device 100C to be sped up.

Other Embodiments

As described above, the present invention was described through the first to fourth embodiments and the variation, but the statements and drawings constituting a portion of this disclosure should not be construed as a limitation of the present invention. Various alternative embodiments and variations will be made obvious to those skilled in the art by the disclosure. For example, the insulating films 33 that were described in the second embodiment and are thicker than the gate insulating films 31 may be applied to the GaN semiconductor devices 100B and 100C that were described in the third and fourth embodiments, respectively. The ohmic junction electrodes 55 that were described in the fourth embodiment may be applied to the GaN semiconductor devices 100, 100A, and 100B that were described in the first to third embodiments, respectively.

As described above, it is needless to say that the present invention includes various embodiments and the like that are not described herein. At least one of various kinds of omission, replacement, and modification of the constituent elements can be performed without departing from the gist of the above-described embodiments and variation. Advantageous effects described herein are only exemplifications and are not specifically limited, and other advantageous effects may be achieved. The technical scope of the present invention should be determined only by the matters used to specify the invention in the claims regarded as appropriate based on the above descriptions.

REFERENCE SIGNS LIST

1 GaN substrate
2 Unit structure
3 Vertical MOSFET
4 Trench
4b Bottom surface
4c First side surface
4d Second side surface
5 PN junction diode
10 GaN single crystal substrate
10a, 20a One surface
10b The other surface
20 GaN layer
21 Impurity region
22 Well region
23 Source region
24 High concentration region
31 Gate insulating film
32, 33 Insulating film
41 Gate electrode
51 Drain electrode
53 Source electrode
54 Schottky junction electrode
55 Ohmic junction electrode 100, 100A, 100B, 100C GaN semiconductor device
SBD Schottky barrier diode

The invention claimed is:

1. A nitride semiconductor device comprising:
a gallium nitride layer having a first principal surface and a second principal surface located on an opposite side to the first principal surface and having a trench formed from the first principal surface to the second principal surface side; and
a field effect transistor formed in the gallium nitride layer, wherein
the trench has a first side surface and a second side surface inside the trench,
the first side surface is a nitrogen face in a surface layer of which nitrogen atoms are located,
the second side surface is a gallium face in the surface layer of which gallium atoms are located, and
the field effect transistor has:
a gate insulating film formed on the first side surface; and
a gate electrode formed in the trench and covering the gate insulating film.

2. The nitride semiconductor device according to claim 1, wherein the first side surface and the second side surface are respectively perpendicular to the first principal surface and face each other.

3. The nitride semiconductor device according to claim 1, wherein a channel of the field effect transistor is formed on a side on which the first side surface is located and is not formed on a side on which the second side surface is located.

4. The nitride semiconductor device according to claim 1 further comprising
an insulating film formed in the trench and covering the second side surface, wherein
thickness of the insulating film is thicker than thickness of the gate insulating film.

5. The nitride semiconductor device according to claim 1 comprising:
a well region of a first conductivity type formed in a region adjacent to the first side surface of the trench in the gallium nitride layer and in which a channel of the field effect transistor is formed; and
a first impurity region of a first conductivity type formed in a region adjacent to the second side surface of the trench in the gallium nitride layer, wherein
the first impurity region has a higher concentration of first conductivity type impurities than the well region.

6. The nitride semiconductor device according to claim 1 further comprising:
a second impurity region of a second conductivity type formed in a region adjacent to the second side surface of the trench in the gallium nitride layer; and
a Schottky junction electrode formed on the first principal surface side of the gallium nitride layer and forming a Schottky junction with the second impurity region.

7. The nitride semiconductor device according to claim 1, wherein the first principal surface is a non-polar plane.

* * * * *